United States Patent
Kauert et al.

(10) Patent No.: US 12,379,231 B2
(45) Date of Patent: *Aug. 5, 2025

(54) METHOD FOR IMPROVING EMC ROBUSTNESS OF INTEGRATED CAPACITIVE SENSORS

(71) Applicant: IDT EUROPE GmbH, Dresden (DE)

(72) Inventors: Reinhard Kauert, Medingen (DE); Martin Schmidt, Dresden (DE)

(73) Assignee: IDT EUROPE GmbH, Dresden (DE)

( * ) Notice: Subject to any disclaimer, the term of this patent is extended or adjusted under 35 U.S.C. 154(b) by 410 days.

This patent is subject to a terminal disclaimer.

(21) Appl. No.: 17/721,279

(22) Filed: Apr. 14, 2022

(65) Prior Publication Data

US 2022/0236308 A1    Jul. 28, 2022

Related U.S. Application Data

(63) Continuation of application No. 15/698,384, filed on Sep. 7, 2017, now Pat. No. 11,320,472.

(30) Foreign Application Priority Data

Sep. 9, 2016  (DE) .................... 10 2016 117 009.7

(51) Int. Cl.
  *G01D 5/24*    (2006.01)
  *G01D 3/032*   (2006.01)
  (Continued)

(52) U.S. Cl.
  CPC ............. *G01D 5/24* (2013.01); *G01D 3/032* (2013.01); *G01R 27/2605* (2013.01);
  (Continued)

(58) Field of Classification Search
  CPC ...... G01D 5/24; G01D 3/032; G01R 27/2605; G01R 31/001; H03M 1/14; H03M 1/60
  See application file for complete search history.

(56) References Cited

U.S. PATENT DOCUMENTS 8,564,313 B1   10/2013  Ryshtun
11,029,795 B2 *  6/2021  Moyal .................. G06F 3/0446
(Continued)

FOREIGN PATENT DOCUMENTS

DE    10252946 B3    7/2004
DE    10339753 A1   12/2004

OTHER PUBLICATIONS

Hagan, "Problem in Obtaining a System: Electromagnetic Compatibility (EMC) Figure of Merit (FOM)", 1974, IEEE Publication, pp. 1-5 (Year: 1974).*

(Continued)

*Primary Examiner* — Elias Desta
(74) *Attorney, Agent, or Firm* — Haynes and Boone, LLP

(57) ABSTRACT

A method is provided for improving the EMC robustness of Integrated Capacitive Sensor systems with a sensor Signal-Conditioner (SSC). The SSC is connected with a capacitive integrating converter to convert a received signal into a bit stream. An oscillator provides a plurality of sampling frequencies. A counter connected with the capacitive integrating converter collects the bit stream and calculates the digital representative of the physical input which is than stored in an output register. The method includes performing some conversions with different sampling frequencies from the oscillator or a frequency divider by the capacitive integrating Signal-Converter; storing the results of the samplings and using the results in the following cycle to calculate for each sampling frequency a difference to the prior sampling of the same frequency; and calculating the digital representative of the input signal from the external sensing capacitor as the reverse weighted average of the samplings of the different frequencies.

15 Claims, 2 Drawing Sheets

(51) Int. Cl.
    *G01R 27/26*         (2006.01)
    *G01R 31/00*         (2006.01)
    *H03M 1/14*          (2006.01)
    *H03M 1/60*          (2006.01)

(52) U.S. Cl.
    CPC ............ *G01R 31/001* (2013.01); *H03M 1/14* (2013.01); *H03M 1/60* (2013.01)

(56) References Cited

U.S. PATENT DOCUMENTS

| | | | |
|---|---|---|---|
| 11,320,472 B2* | 5/2022 | Kauert | ................. G01R 31/001 |
| 2015/0171890 A1 | 6/2015 | Pagnanelli | |
| 2016/0188085 A1 | 6/2016 | Leigh | |

OTHER PUBLICATIONS

Extended European Search Report dated Feb. 13, 2018 issued in related European patent application No. 17190342.0 (9 pages).

* cited by examiner

METHOD FOR IMPROVING EMC ROBUSTNESS OF INTEGRATED CAPACITIVE SENSORS

RELATED APPLICATIONS

This application is a Continuation of U.S. patent application Ser. No. 15/698,384 filed Sep. 7, 2017, which claims priority to German Patent Application No. 10 2016 117 009.7 filed Sep. 9, 2016, which are incorporated herein by reference in their entirety as part of the present disclosure.

FIELD OF THE INVENTION

The invention addresses to a method for improving the EMC robustness of Integrated Capacitive Sensor systems with a Sensor Signal-Conditioner and describes a system approach capable to reduce the spectral noise sensitivity of such sensors significantly.

BACKGROUND

Sensor Signal-Conditioner (SSC) for capacitive sensors has to cope with the task to avoid the effect of growing EMC susceptibility coupled to the sensitivity of the system. Especially the sensitivity of a Switched Capacitor Integrator to interference frequencies equal or multiple to the sampling frequency—called aliasing effect—is hard to avoid and is one of the main challenges in the design of such a system. EMC is the abbreviation for electromagnetic compatibility and EMC standards are used for products operating in particular EMC environment.

To avoid such aliasing effects it is well known in the prior art to filter the input signal by a low-pass filter, the so called anti-aliasing filter. Such a filter, called as high-cut or treble cut filter, effects that high frequencies are cut out and it is very important to use the anti-aliasing filter before the sensor signal will be digitalized.

Other known previous solutions are a RC filter between sensor cap and integrated ADC (only low pass characteristic) combined with spread spectrum Technology to reduce aliasing (only helpful for higher multiples of sampling frequency).

SUMMARY

It is an object of the invention to reduce the spectral noise sensitivity of Sensor Signal-Conditioner significantly and addresses the EMC weakness of capacitive sensor systems.

In accordance with some methods, a method for improving the EMC robustness of Integrated Capacitive Sensor systems with a Sensor Signal-Conditioner is presented. The Sensor Signal-Conditioner, having an external capacitor representing the physical quantity to be sensed, is connected with a capacitive integrating converter to convert this capacity into a bit stream and an oscillator providing sampling frequency for the capacitive integrating converter and a counter connected with the capacitive integrating converter, whereby a controller is connected with a counter which collects the bit stream and calculates the digital representative of the physical input which is then stored in an output register, comprising the steps of
performing some conversions with different sampling frequencies from the oscillator or a frequency divider by the capacitive Sensor Signal-Converter;
storing the results of the samplings and using the results in the following cycle to calculate for each sampling frequency a difference to the prior sampling of the same frequency; and
calculating the digital representative of the input signal from the external sensing capacitor as the reverse weighted average of the samplings of the different frequencies.

In some embodiments, the method further comprises an oscillator or clock divider generating at least two sampling frequencies with $f_A = f_{CLK}/(2x)$ and $f_B = f_{CLK}/x$.

It is possible to generate the at least two different sampling frequencies by the oscillator or a frequency divider sequential or parallel.

In a further embodiment the method comprises more conversions with a third or other sampling frequency being three times $f_{CLK}$ or other times generated by the oscillator or the frequency divider.

In another refinement of the invention the at least two different sampling frequencies are integer or non-integer shares of the oscillator clock.

In a further embodiment of the invention the difference of the last two or more subsequent measurements minus minimum of the differences of the two (or more) frequency channels <A; B; . . . > are used for calculating the digital representative of the input signal.

The method according the invention reduces the spectral noise sensitivity of capacitive Sensor Signal-Conditioner significantly.

BRIEF DESCRIPTION OF THE DRAWINGS

The following will be a detailed description of embodiments of the invention with reference to the accompanying drawings.

DETAILED DESCRIPTION

Figure 1:
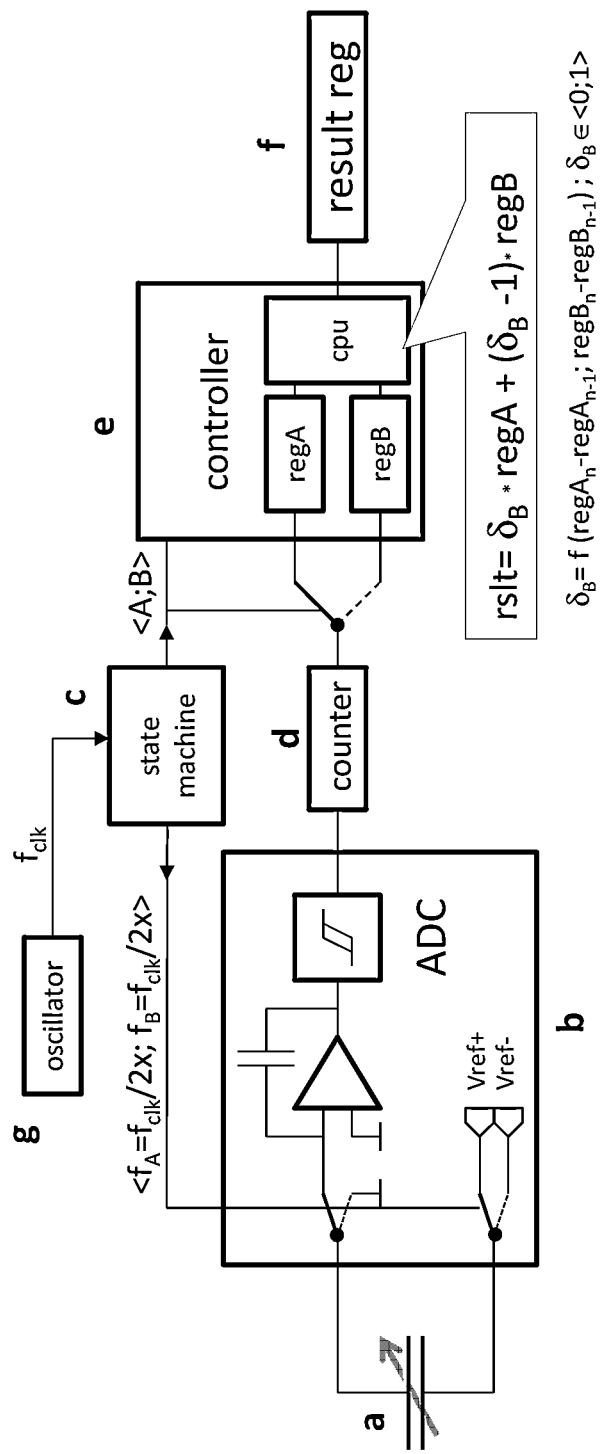
FIG. 1 shows a block diagram of a capacitive sensor signal-conditioner (SSC) which is operated according the new method for improving the EMC robustness.
Figure 2:
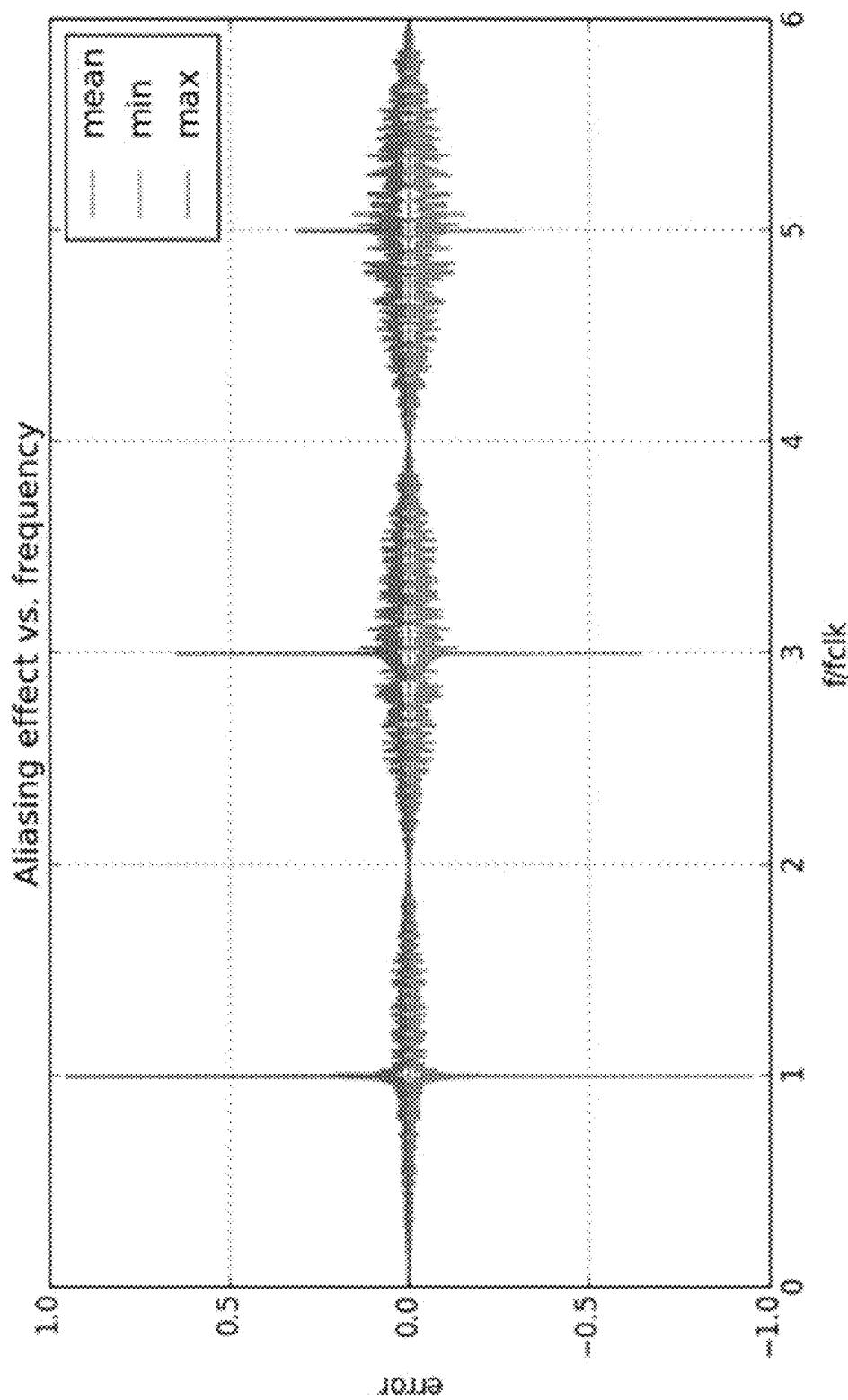
FIG. 2 shows a schema demonstrating the aliasing effect vs. frequency.

The system described here consists according FIG. 1 of an external capacitor (a) representing the physical quantity to be sensed, which is connected with the input of a capacitive integrating converter (ADC) (b) to convert this capacity (a) into a bit stream and also connected with reference voltage sources Vref+ and Vref−.

The capacitive integrating converter (b) comprises an operational amplifier with capacitive feedback followed by an analog/digital signal converter (ADC) or, at least a comparator.

An oscillator (g) delivers a clock with a frequency $f_{OSC}$ to a state machine (c). This state machine (c) works as a frequency divider and provides the sampling frequency $f_A$ as well as $f_B$ and delivers the control signals of the capacitive integrating converter (ADC) (b) and a counter (d) connected with the output of the capacitive integrating converter (b). A controller (e) connected with the state machine (c) and a counter (d) which collects the bit stream and calculates the digital representative of the physical input which is than stored in an output register (f) connected with the output of the controller (e). This Capacitive Sensor Signal-Conditioner (SSC) is based on a system scheme which is widely used and well known for such Signal-Conditioner.

The new idea consists of two parts:

First, the main part of the capacitive Sensor Signal-Conditioner (SSC) is the capacitive integrating converter (ADC) (b) which works on the principle of cyclic charge transfer from external sensing capacitor (a) to the internal integrator cap—this is done with a certain sampling clock of the oscillator (g) or generated by the state machine (c).

Instead of a sampling frequency with only one frequency, the capacitive Sensor Signal-Conditioner (SSC) now performs sequential or parallel two (or more) conversions <A;B; . . . > with different sampling frequencies. These different frequencies may be generated directly from the oscillator (g) or by dividing the oscillator clock $f_{OSC}$ into integer or non-integer shares of the oscillator clock $f_{OSC}$ with a configurable counter inside the state machine (c).

Especially two samplings are used, the first with frequency $f_A$ and the second with frequency two times $f_A$ or in case of more conversions with three or other times $f_A$.

Second, the results of both (or more) samplings with $f_A$ and $f_B$ are stored and used in the following cycle to calculate for each sampling a difference to the prior sampling of the same frequency $f_A$ or $f_B$ respectively.

The result (rslt) as digital representative of the input signal from the external sensing capacitor (a) is than calculated as the reverse weighted average of the samplings obtained with the two (or more) different frequencies ($reg_A$, $reg_B$).

$$rslt = \delta_B \, regA + (\delta_B - 1) reg_B \tag{1}$$

$\delta_B$: Weight of frequency channel B from normalized absolute difference of the last two or more subsequent measurements at frequency channel B.

This means, the higher the noise at one sample frequency represented by a normalized absolute difference or another statistical relevant parameter, the lower is the influence of this channel to the result. This explores the property of the system to show a huge noise due to phase beat around aliasing frequency compared to the noise at any other frequency.

Instead of simple difference, a more sophisticated statistical deviation parameter may be used to determine the weights. Especially a formulae considering the difference between actual and stored weight of the last cycle shall be used. This may include configurable low pass filtering of fast changes of the weights to control robustness in dynamic of the algorithm.

Further, instead of using the difference of subsequent measurements, the difference minus minimum of the differences of the two (or more) frequency channels <A; B; . . . > shall be used.

The invention described above reduces the aliasing effect significantly. This will improve DPI or BCI test results even in case of very high spectral resolution.

What is claimed is:

1. A capacitive sensor signal-conditioner, comprising:
   a capacitive integrating converter, the capacitive integrating converter including an operational amplifier with a capacitive feedback coupled to receive a signal from an external capacitor representing a physical quantity to be sensed and an analog-to-digital converter (ADC) coupled to receive a signal from the operational amplifier, the capacitive integrating converter sampling the signal from the signal at different sampling frequencies and creating a bit stream;
   a controller coupled to the capacitive integrating converter and coupled to receive the different sampling frequencies, the controller configured to store the bit stream from each of the different sampling frequency samplings and to use the stored bitstream in the following sampling cycle to calculate, for each of the different sampling frequencies, a difference to the prior sampling of the same frequency and further configured to calculate a digital representative of the input signal from the external capacitor as a reverse weighted average of the samplings of the different sampling frequencies; and
   a result register coupled to the controller to store the reverse weighted average.

2. The capacitive sensor signal conditioner according to claim 1, further including a counter coupled between the capacitive integrating converter and the controller.

3. The capacitive sensor signal conditioner according claim 1, further comprising an oscillator and a state machine configured to generate the different sampling frequencies from an oscillator frequency (fCLK) generated by the oscillator, the different sampling frequencies including at least two sampling frequencies with a first frequency fA=fCLK/(2x) and a second frequency fB=fCLK/x, where x indicates that fA and fB are integer or non-integer shares of the oscillator frequency fCLK.

4. The capacitive sensor signal conditioner according claim 3, wherein the at least two different sampling frequencies are generated sequentially or in parallel.

5. The capacitive sensor signal conditioner according claim 4, wherein the at least two different sampling frequencies includes more than two different sampling frequencies.

6. The capacitive sensor signal conditioner according claim 3, wherein the at least two different sampling frequencies are integer shares of the oscillator clock frequency.

7. The capacitive sensor signal conditioner according to claim 3, wherein the at least two different sampling frequencies are non-integer shares of the oscillator frequency.

8. The capacitive sensor signal conditioner according to claim 1, wherein the difference of the last two or more subsequent measurements minus minimum of the differences of different sampling frequencies are used for calculating the digital representative of the input signal.

9. A method, comprising:
   sampling, in a capacitive integrating converter, a signal from an external capacitor at a plurality of sampling frequencies, the external capacitor representing a physical quantity to be sensed;
   digitizing, in the capacitive integrating converter, each of the signal from each of the plurality of sampling frequencies to provide digitized sample signals;
   storing, in a controller, the digitized sample signals associated with each of the plurality of sampling frequencies;
   calculating, in the controller, differences between the digitized sample signals and stored previously digitized sampled signals of each of the plurality of sampling frequencies;
   calculating, in the controller, a reverse weighted average of the samplings at different frequencies from the differences to form a digital representative of the signal; and
   storing, in an output register, the digital representative corresponding to the physical quantity.

10. The method of claim 9, further including generating, with an oscillator producing an oscillator frequency (fCLK) and a state machine coupled to receive the oscillating frequency, the plurality of sampling frequencies.

11. The method of claim 10, wherein the plurality of sampling frequencies including at least two sampling frequencies with first frequency fA=fCLK/(2x) and second frequency fB=fCLK/x, where x indicates that fA and fB are integer or non-integer shares of the oscillator frequency fCLK.

12. The method of claim 10, wherein generating the plurality of sampling frequencies includes generating the plurality of sampling frequencies sequentially or in parallel.

13. The method of claim 10, wherein the plurality of sampling frequencies are integer shares of the oscillator frequency.

14. The method of claim 10, wherein the plurality of sampling frequencies are non-integer shares of the oscillator frequency.

15. The method of claim 9, wherein calculating a reverse weighted average comprises:
   storing a bit stream from each of the plurality of sampling frequencies;
   calculating, for each of the plurality of sampling frequencies, a difference to prior sampled bit streams at the same sampling frequency; and
   calculating the reverse weighted average from the differences to form the digital representative.

* * * * *